(12) United States Patent
Forbes et al.

(10) Patent No.: US 7,427,536 B2
(45) Date of Patent: Sep. 23, 2008

(54) HIGH DENSITY STEPPED, NON-PLANAR NITRIDE READ ONLY MEMORY

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 11/399,761

(22) Filed: Apr. 7, 2006

(65) Prior Publication Data

US 2006/0180876 A1    Aug. 17, 2006

Related U.S. Application Data

(62) Division of application No. 10/899,906, filed on Jul. 27, 2004, now Pat. No. 7,138,681.

(51) Int. Cl.
*H01L 21/82* (2006.01)
*H01L 21/3205* (2006.01)
*H01L 21/4763* (2006.01)

(52) U.S. Cl. .................. 438/128; 438/129; 438/589; 257/E21.662

(58) Field of Classification Search .............. 438/128, 438/129, 243, 259, 589, 591; 257/E21.662, 257/E21.667

See application file for complete search history.

(56) References Cited

U.S. PATENT DOCUMENTS

| | | | |
|---|---|---|---|
| 6,555,870 B1 * | 4/2003 | Kirisawa | 257/324 |
| 6,583,479 B1 | 6/2003 | Fastow | |
| 6,627,945 B1 | 9/2003 | Tripsas | |
| 6,670,246 B1 | 12/2003 | Hsiao | |
| 6,720,217 B2 | 4/2004 | Kim | |
| 7,078,273 B2 * | 7/2006 | Matsuoka et al. | 438/128 |
| 7,238,599 B2 * | 7/2007 | Forbes | 438/589 |
| 2006/0180876 A1 * | 8/2006 | Forbes et al. | 257/390 |
| 2006/0183271 A1 * | 8/2006 | Forbes et al. | 438/128 |
| 2006/0208305 A1 * | 9/2006 | Forbes et al. | 257/314 |
| 2006/0221670 A1 * | 10/2006 | Forbes et al. | 365/149 |
| 2006/0261404 A1 * | 11/2006 | Forbes | 257/324 |
| 2007/0029610 A1 * | 2/2007 | Wei et al. | 257/345 |
| 2007/0170496 A1 * | 7/2007 | Foley | 257/324 |

* cited by examiner

*Primary Examiner*—Walter L Lindsay, Jr.
(74) *Attorney, Agent, or Firm*—Leffert Jay & Polglaze, P.A.

(57) ABSTRACT

A non-planar, stepped NROM array is comprised of cells formed in trenches and on pillars that are etched into a substrate. Each cell has a plurality of charge storage regions in its nitride layer and a pair of source/drain regions that are shared with adjacent cells in a column. The source/drain regions, formed in the pillar/trench sidewalls, couple the column cells serially into bitlines. The rows of the array are each coupled by a wordline. A second set of trenches separates the columns of cells.

20 Claims, 4 Drawing Sheets

HIGH DENSITY STEPPED, NON-PLANAR NITRIDE READ ONLY MEMORY

RELATED APPLICATION

This Application is a Divisional of U.S. application Ser. No. 10/899,906, titled "HIGH DENSITY STEPPED, NON-PLANAR NITRIDE READ ONLY MEMORY" filed Jul. 27, 2004, now U.S. Pat. No. 7,138,681 which is commonly assigned and incorporated herein by reference.

TECHNICAL FIELD OF THE INVENTION

The present invention relates generally to memory devices and in particular the present invention relates to an NROM device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

FIG. 1 shows a cross-section of a typical prior art NROM array. The array is comprised of a silicon substrate 100 with a gate oxide layer 101 formed over the substrate 100. A silicon nitride layer 102 is formed over the gate oxide 101. Each transistor 140-142 is comprised of two charge storage regions 110 and 111 in the nitride layer 102. An intergate insulator 107 is formed over the nitride layer 102 prior to forming the control gate/wordline 120-122 of each transistor 140-142 over the intergate insulator 107 and substantially between the source/drain regions 130-133.

The minimum feature size of the transistors 140-142 of FIG. 1 is described by F. The density is therefore one bit for each $4F^2$ units surface area. This is typically described as a density of $4F^2$/bit.

As computers become smaller and their performance increase, the computer components should also go through a corresponding size reduction and performance increase. To accomplish this, the transistors can be reduced in size. This has the effect of increased speed and memory density with decreased power requirements.

However, a problem with decreased flash memory size is that flash memory cell technologies have some scaling limitations due to the high voltage requirements for program and erase operations. As MOSFETs are scaled to deep sub-micron dimensions, it becomes more difficult to maintain an acceptable aspect ratio. Not only is the gate oxide thickness scaled to less than 10 nm as the channel length becomes sub-micron but the depletion region width and junction depth must be scaled to smaller dimensions.

For the reasons stated above, and for other reasons stated below which will become apparent to those skilled in the art upon reading and understanding the present specification, there is a need in the art for a memory device having increased memory density and performance.

DETAILED DESCRIPTION

Figure 1:
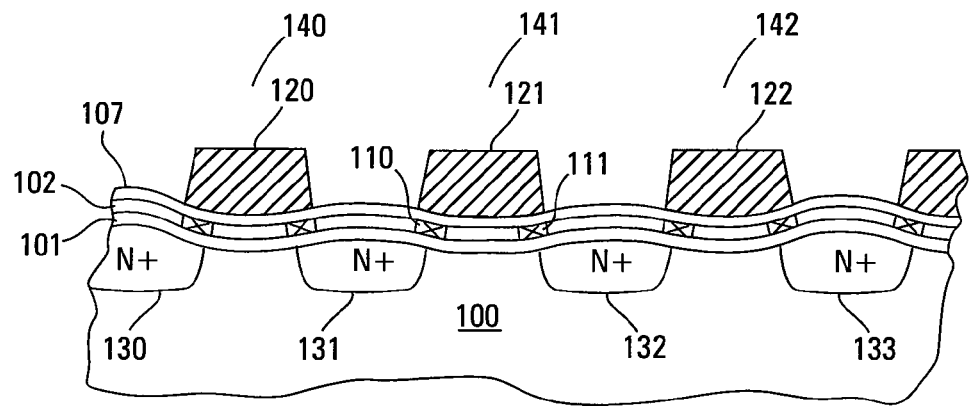
FIG. 1 shows a cross-sectional view of a typical prior art planar NAND NROM array.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 2:
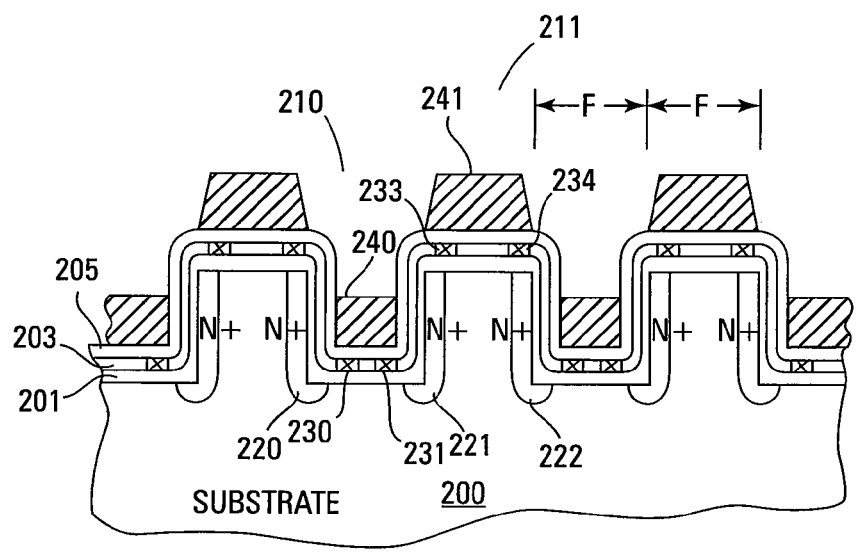
FIG. 2 shows a cross-sectional view of one embodiment of a non-planar, stepped NROM array of the present invention.

FIG. 2 illustrates a cross-sectional view of one embodiment of a stepped, non-planar NROM flash memory array of the present invention. The memory cells are fabricated on a trenched substrate 200 with steps between the adjacent devices along the row of series connected transistors. The transistors are not vertical structures but are conventional devices with conduction in channels that are parallel to the substrate surface. These devices achieve a density of $1F^2$/bit with multiple level cell storage.

A portion of the array illustrated in FIG. 2 is comprised of a column of transistors of which two 210 and 211 are discussed. An upper plane transistor 211 is fabricated on a pillar on the substrate 200. A lower plane transistor 210 is fabricated in a trench of the substrate 200.

Source/drain regions 220-222 are doped into the pillar/trench sidewalls. These regions 220-222 couple adjacent transistors of each plane together into columns (i.e., bitlines) of a NAND architecture memory array. The upper plane transistor 211 uses source/drain regions 221 and 222 while the lower plane transistor 210 uses source/drain regions 220 and 221. These two transistors 210 and 211 are coupled by the shared source/drain region 221.

Channel regions exist at the top of each pillar and the bottom of each trench between the source/drain regions 220-222. During operation of the transistor 210 and 211, a channel forms between the source/drain regions 220 and 221 or 221 and 222 in the particular channel region of the operating transistor.

In one embodiment, the source/drain regions 220-222 are n+ regions that are doped into a p-type substrate. However, the source/drain regions and substrate of the present invention are not limited to any one conductivity type.

A first dielectric layer 201 is formed over the substrate 200 including both the pillars and the trenches and pillar/trench sidewalls. A silicon nitride layer 203 is formed over the oxide layer 201. This layer 203 comprises the charge storage regions near the source/drain regions 220-222 for each particular transistor. In the illustrated embodiment, each transistor 210 or 211 has two charge storage regions 230 and 231 or 233 and 234. Alternate embodiments may have different quantities of charge storage regions.

A second dielectric layer 205 is formed over the nitride layer 203. Polysilicon control gates/wordlines 240 and 241 are formed over the second dielectric layer 205 and substantially between each source/drain region 220-222 for either the pillar transistor 211 or the trench transistor 210.

In one embodiment, the two dielectric layers are comprised of an oxide such that an oxide—nitride—oxide (ONO) gate insulator is formed. Alternate embodiments may use other dielectric materials.

As shown later, with reference to FIG. 6, the wordlines couple each memory array row of transistors. In the embodiment of FIG. 2, one wordline 240 couples a row of the lower plane of transistors (i.e., the trenches). Another wordline 241 couples a row of the upper plane of transistors (i.e., the pillars).

The gate insulator and/or the intergate insulator between the nitride layer and the polysilicon wordlines can be high-k dielectrics (i.e., dielectric constant greater than that of $SiO_2$), composite insulators, silicon oxide, or some other insulator. Silicon dioxide ($SiO_2$) is an insulator with a relative dielectric constant of 3.9. A high-k gate insulator requires smaller write and erase voltages due to the reduced thickness layer between the control gate and the floating gate. These dielectric layers may be formed by atomic layer deposition (ALD), evaporation, or some other fabrication technique.

As is well known in the art, ALD is based on the sequential deposition of individual monolayers or fractions of a monolayer in a well-controlled manner. Gaseous precursors are introduced one at a time to the substrate surface and between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor. The most commonly used oxygen source materials for ALD are water, hydrogen peroxide, and ozone. Alcohols, oxygen and nitrous oxide can also been used.

ALD is well suited for deposition of high-k dielectrics such as $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2/Hf$, $ZrAl_xO_y$, $CrTiO_3$, and $ZrTiO_4$.

The dielectric layers of the present invention can also be formed by evaporation. Dielectric materials formed by evaporation can include: $TiO_2$, $HfO_2$, $CrTiO_3$, $ZrO_2$, $Y_2O_3$, $Gd_2O_3$, $PrO_2$, $ZrO_xN_y$, Y—Si—O, and $LaAlO_3$.

Very thin films of $TiO_2$ can be fabricated with electron-gun evaporation from a high purity $TiO_2$ slug (e.g., 99.9999%) in a vacuum evaporator in the presence of an ion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3-4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°-200° C.). Since there is no plasma and ion bombardment of the substrate (as in the case of sputtering), the original atomically smooth surface of the silicon substrate is maintained. The second step is oxidation to form the desired $HfO_2$.

The first step in the deposition of CoTi alloy film is by thermal evaporation. The second step is the low temperature oxidation of the CoTi film at 400° C. Electron beam deposition of the CoTi layer minimizes the effect of contamination during deposition. The CoTi films prepared from an electron gun possess the highest purity because of the high-purity starting material. The purity of zone-refined starting metals can be as high as 99.999%. Higher purity can be obtained in deposited films because of further purification during evaporation.

A two-step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O_3$ films may be accomplished with a two-step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°-200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°-200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The formation of a Y—Si—O film may be accomplished in one step by co-evaporation of the metal (Y) and silicon dioxide ($SiO_2$) without consuming the substrate Si. Under a suitable substrate and two-source arrangement, yttrium is evaporated from one source, and $SiO_2$ is from another source. A small oxygen leak may help reduce the oxygen deficiency in the film. The evaporation pressure ratio rates can be adjusted easily to adjust the Y—Si—O ratio.

The prior art fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800°-900° C. in RTA for ten to fifteen seconds in $N_2$ ambience.

The above described ALD and evaporation techniques are for purposes of illustration only. The embodiments of the present invention are not limited to any one dielectric material or dielectric fabrication technique.

Figure 3:
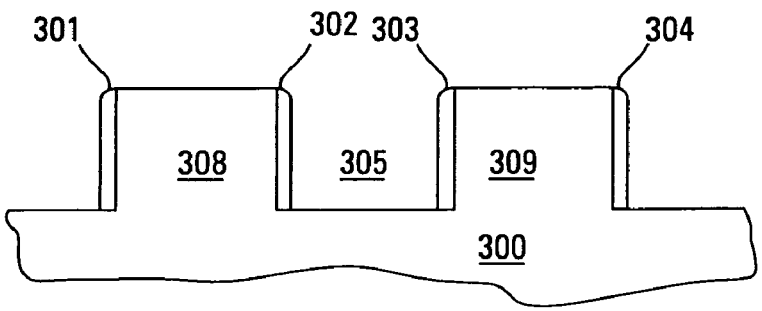
FIG. 3 shows a cross-sectional view of fabrication steps for one embodiment of the present invention in accordance with the array of FIG. 2.

FIG. 3 illustrates an embodiment for fabricating the non-planar NROM array of FIG. 2. The substrate 300 is etched to produce trenches 305 between the substrate pillars 308 and 309. A doped oxide is deposited over the trenches 305 and pillars 308 and 309. This oxide layer is directionally etched to leave the oxide only on the sidewalls 301-304 of the trenches.

Figure 4:
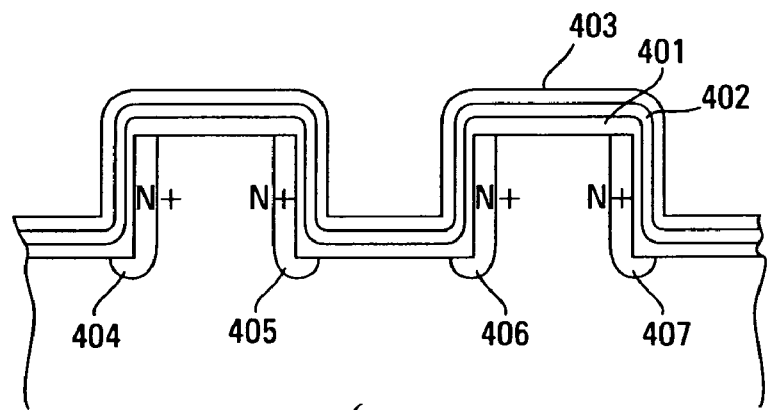
FIG. 4 shows a cross-sectional view of additional steps for one embodiment of the fabrication method of the present invention in accordance with the array of FIG. 2.

During a subsequent anneal process, the sidewall oxide forms the source/drain regions 404-407 of the transistors as illustrated in FIG. 4. The sidewall oxide layers are then removed.

In one embodiment, conventional techniques are employed to provide an oxide layer 401, nitride layer 402, and an oxide intergate layer 403 (ONO) as is described, for example, in "NROM: A Novel Localized Trapping, 2-Bit Nonvolatile Memory Cell", by Boaz Eitan et al., IEEE Electron Device Letters, Vol. 21, No. 11, November 2000, pp. 543-545, IEEE Catalogue No. 0741-3106/00, or in "A True Single-Transistor Oxide—Nitride—Oxide EEPROM Device" by T. Y. Chan et al., IEEE Electron Device Letters, Vol. EDL-8, No. 3, March, 1987, pp. 93-95, IEEE Catalogue No. 0741-3106/87/0300-0093.

In one embodiment, the thin oxide, nitride, and oxide layers combine to form the ONO gate insulator layer, such as is employed in SONOS devices. In one embodiment, the gate insulator has a thickness of approximately 10 nanometers (nm).

In alternative embodiments, the gate insulator is selected from the group of silicon dioxide ($SiO_2$) formed by wet oxidation, silicon oxynitride (SON), silicon rich oxide (SRO), and silicon rich aluminum oxide ($Al_2O_3$).

In still other embodiments, the gate insulator may be selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In still other embodiments, the gate insulator includes a composite layer selected from the group of an oxide—aluminum oxide ($Al_2O_3$)-oxide composite layer, an oxide—silicon oxycarbide—oxide composite layer, and an oxide—nitride—aluminum oxide composite layer.

The aluminum oxide top layer has a higher dielectric constant so that this layer can be thicker in order to preclude tunneling to and from the control gate to the nitride storage layer. Alternate embodiments use other high dielectric constant insulators as the top layer.

In still other embodiments, the gate insulator includes a composite layer, or a non-stoichiometric single layer of two or more materials selected from the group of silicon (Si), titanium (Ti), and tantalum (Ta).

Figure 5:
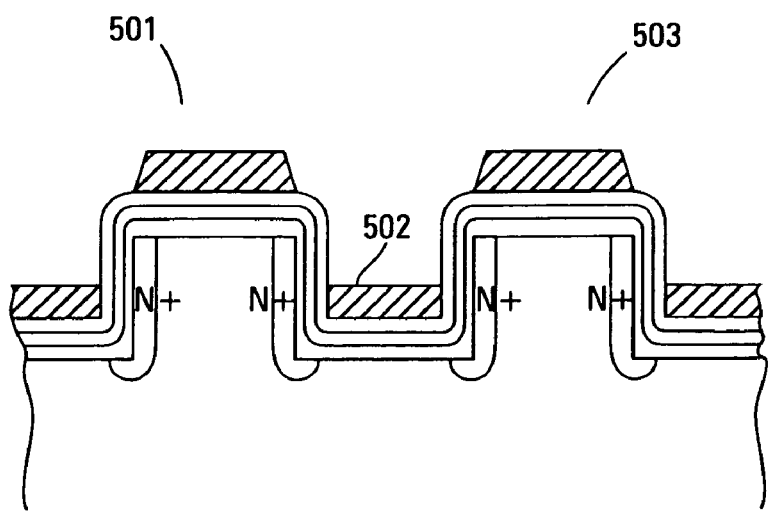
FIG. 5 shows a cross-sectional view of additional steps for one embodiment of the fabrication method of the present invention in accordance with the array of FIG. 2.

FIG. 5 illustrates that a polysilicon wordline/control gate layer 501-503 is formed over the gate insulator. This process may be a directional, anisotropic deposition of polysilicon. Alternate embodiments may use other materials and/or processes for forming the wordlines/control gates.

Figure 6:
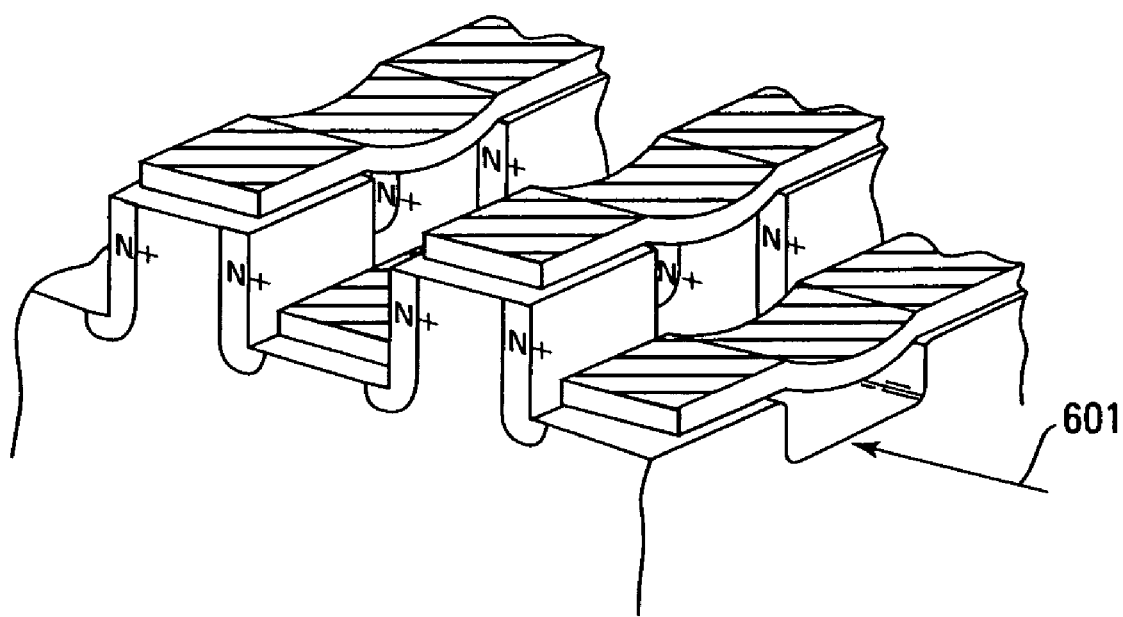
FIG. 6 shows a three dimensional, cross-sectional view of one embodiment of the array of FIG. 2.

As is illustrated in FIG. 6, the structures have been masked and a second set of trenches is etched perpendicular 601 to the original trenches. This separates the ONO structures of each cell, clears the sidewalls, and forms the pillars with source/drain regions along two of the sidewalls. In one embodiment, the second set of trenches is etched deeper into the substrate than the first set in order to affect a separation of the source/drain regions along the subsequent wordline/control gate.

FIG. 6 shows that each row of transistors in the upper plane is coupled together along the same wordline. Similarly, each row of the lower plane of transistors is coupled together along the same wordline.

SONOS devices are capable of storing more than one bit per gate. Typically, the hot carriers are injected into one side of the ONO layer, adjacent a source/drain region, to provide a high electrical field. By reversing the polarity of the potentials applied to the source/drain regions, charge may be injected into the other side of the ONO layer.

In operation, application of suitable electrical biases to the source/drain regions and the control gate cause hot majority charge carriers to be injected into the nitride layer and become trapped, providing a threshold voltage shift and thus providing multiple, alternative, measurable electrical states representing stored data. "Hot" charge carriers are not in thermal equilibrium with their environment. In other words, hot charge carriers represent a situation where a population of high kinetic energy charge carriers exist. Hot charge carriers may be electrons or holes.

The stepped, non-planar NROM flash memory devices of the present invention can be programmed with tunnel injection using positive gate voltages with respect to the substrate/p-well. In another embodiment, channel hot electron injection can be used in a programming operation. This is accomplished by applying a positive drain voltage (e.g., +6 to +9V) to a first source/drain region, a positive voltage to the control gate (e.g., +12V) and grounding the second source/drain region to create a hot electron injection into the gate insulator of the charge storage region.

An alternate embodiment programming operation uses substrate enhanced hot electron injection (SEHE). In this embodiment, a negative substrate bias is applied to the p-type substrate. This bias increases the surface lateral field near a source/drain region thus increasing the number of hot electrons. The benefit of such an embodiment is that a lower drain voltage is required during programming operations. In one embodiment, the negative substrate bias is in the range of 0V to −3V. Alternate embodiments may use other voltage ranges.

For an erase operation, one embodiment uses tunneling with conventional negative gate voltages with respect to the substrate/p-well. In another embodiment, the control gate is grounded, the drain connection is left floating and the source region has a positive voltage applied (e.g., +12V). Alternate embodiments for erase operations can use other methods such as substrate enhanced band-to-band tunneling induced hot hole injection (SEBBHH) that are well known in the art.

While above-described figures are to a NAND NROM flash memory device, the present invention is not limited to such a structure. For example, using a virtual ground array that is well known in the art, the stepped, non-planar NROM array can be fabricated in a NOR architecture. In the NOR configuration, the cells are arranged in a matrix. The gates of each floating gate memory cell of the array matrix are connected by rows to wordlines and their drains are connected to column bitlines. The source of each floating gate memory cell is typically connected to a common source line. Still other embodiments can use other architectures.

Figure 7:
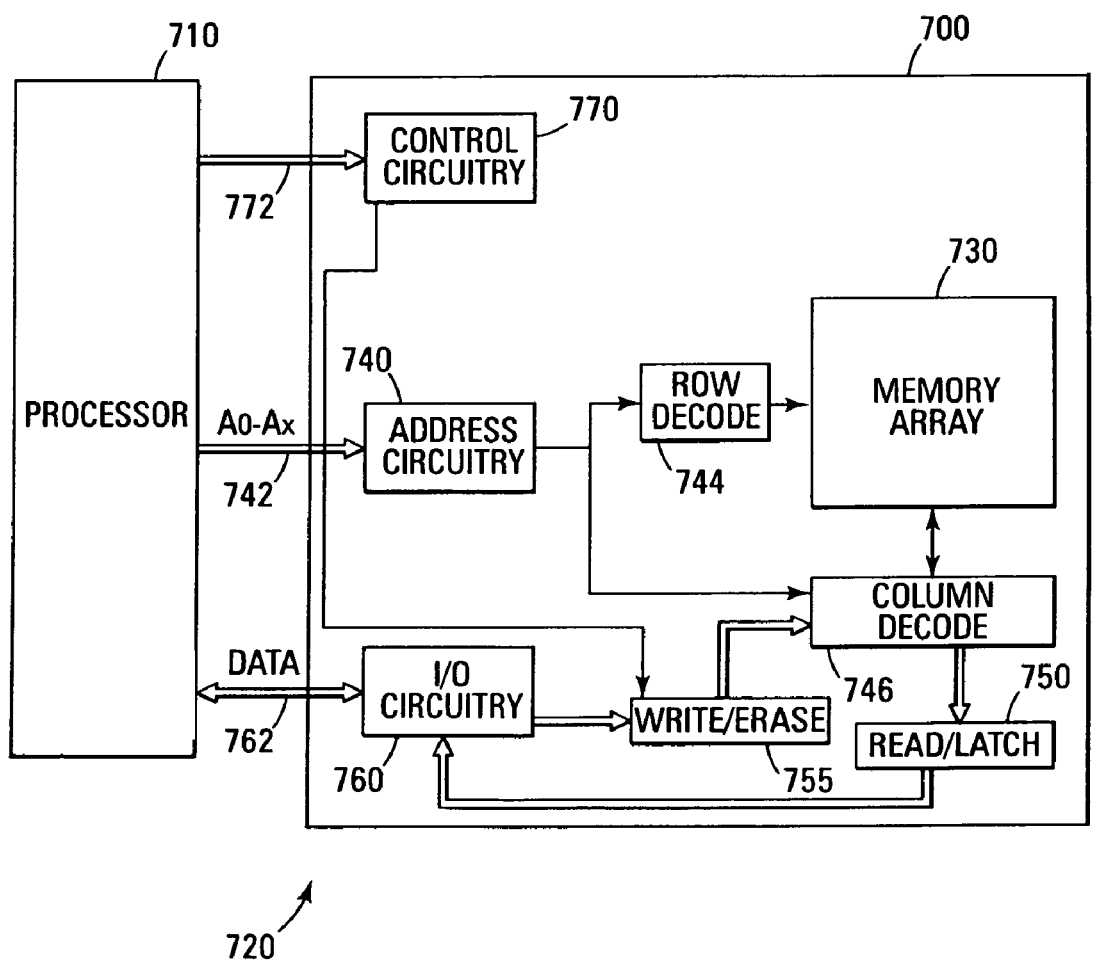
FIG. 7 shows a block diagram of an electronic system that incorporates the non-planar, stepped NROM array of the present invention.

FIG. 7 illustrates a functional block diagram of a memory device 700 that can incorporate the flash memory cells of the present invention. The memory device 700 is coupled to a processor 710. The processor 710 may be a microprocessor or some other type of controlling circuitry. The memory device 700 and the processor 710 form part of an electronic system 720. The memory device 700 has been simplified to focus on features of the memory that are helpful in understanding the present invention.

The memory device includes an array of NROM, flash memory cells 730 that can be comprised of the stepped, non-planar NROM cells illustrated previously. The memory array 730 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 740 is provided to latch address signals provided on address input connections A0-Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over a plurality of data connections 762 with the controller 710. Write circuitry 755 is provided to write data to the memory array.

Control circuitry 770 decodes signals provided on control connections 772 from the processor 710. These signals are used to control the operations on the memory array 730, including data read, data write (program), and erase operations. The control circuitry 770 may be a state machine, a sequencer, or some other type of controller.

The memory device illustrated in FIG. 7 has been simplified to facilitate a basic understanding of the features of the memory. A more detailed understanding of internal circuitry and functions of NROM memories are known to those skilled in the art.

CONCLUSION

In summary, the stepped, non-planar NROM flash memory cells of the present invention provide a high-density memory array with multiple level storage in a nitride layer. The density, in one embodiment, is $1F^2$/bit versus the typical $4F^2$/bit of the prior art conventional NAND flash memory structure. The memory cells of one array column (i.e., bitline) are divided up into an upper plane of cells and a lower plane of cells. In the NAND configuration, the cells are coupled in series through the source/drain regions. In the NOR configuration, the cells are arranged in a matrix.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for fabricating a non-planar, stepped NROM array, the method comprising:
   forming a first set of trenches in a substrate, each pair of trenches defining a pillar;
   forming source/drain regions in sidewalls of the first set of trenches;
   forming a gate insulator layer over the substrate;
   etching second set of trenches in the substrate in a direction that is substantially perpendicular to the first set of trenches; and
   forming a wordline over the gate insulator layer in each of the first set of trenches and on each pillar such that the wordlines are substantially parallel to the first set of trenches.

2. The method of claim 1 wherein the gate insulator layer is formed by forming a first dielectric layer over the substrate, forming a silicon nitride layer over the first dielectric layer, and forming a second dielectric layer over the silicon nitride layer.

3. The method of claim 1 wherein forming the first set of trenches in the substrate comprises etching the first set of trenches in a p-type silicon material.

4. The method of claim 1 wherein forming source/drain regions comprises:
   depositing a doped oxide on the substrate;
   directionally etching the doped oxide to leave the doped oxide remaining on the sidewalls;
   annealing the remaining doped oxide; and
   removing the remaining doped oxide.

5. The method of claim 2 wherein the first and second dielectric layers are formed by oxidation.

6. The method of claim 2 wherein the first and second dielectric layers are formed by deposition.

7. The method of claim 1 wherein the second set of trenches is etched to a greater depth in the substrate than the first set of trenches.

8. The method of claim 2 wherein the first and second dielectric layers are high-k dielectric materials that are formed by atomic layer deposition and are comprised of one of: $AlO_x$, $LaAlO_3$, $HfAlO_3$, $Pr_2O_3$, Lanthanide-doped $TiO_x$, HfSiON, Zr—Sn—Ti—O films using $TiCl_4$ or $TiI_4$, ZrON, $HfO_2$/Hf, $ZrAl_xO_y$, $CrTiO_3$, or $ZrTiO_4$.

9. The method of claim 2 wherein the first and second dielectric layers are high-k dielectric materials that are formed by evaporation and are comprised of one of:
$TiO_2$, $HfO_2$, $CrTiO_3$, $ZrO_2$, $Y_2O_3$, $Gd_2O_3$, $PrO_2$, $ZrO_xN_y$, Y—Si—O, or $LaAlO_3$.

10. The method of claim 1 wherein the gate insulator layer is a composite layer.

11. The method of claim 1 wherein the gate insulator layer is an oxide—nitride—oxide composite layer.

12. A method for fabricating a non-planar, stepped NROM flash memory array, the method comprising:
    etching a first set of trenches in a substrate to form pillars between the trenches;
    forming source/drain regions in sidewalls of the first set of trenches such that channel regions can form between source/drain regions at the top of each pillar and at the bottom of each of the first set of trenches;
    forming a first oxide layer over the substrate;
    forming a silicon nitride layer over the first oxide layer;
    forming a second oxide layer over the silicon nitride layer;
    etching a second set of trenches that are substantially perpendicular to the first set of trenches; and
    forming a plurality of wordlines substantially parallel to the first set of trenches, each wordline coupling either a row of cells over each pillar or a row of cells in each trench.

13. The method of claim 12 wherein the source/drain regions are n+ doped regions and the substrate is a p-type silicon.

14. The method of claim 12 wherein forming the plurality of wordlines comprises a directional, anisotropic deposition of polysilicon.

15. A method for fabricating a non-planar, stepped NROM array, the method comprising:
    forming a first set of trenches in a substrate, each pair of trenches defining a pillar;
    forming source/drain regions along sidewalls of each trench of the first set of trenches;
    forming a multiple layer gate insulator layer over the substrate;
    etching a second set of trenches in the substrate in a direction that is substantially perpendicular to the first set of trenches; and
    forming a wordline over the gate insulator layer in each of the first set of trenches and on each pillar such that the wordlines are substantially parallel to the first set of trenches.

16. The method of claim 15 wherein forming the multiple layer gate insulator layer comprises forming an ONO structure.

17. The method of claim 16 wherein the nitride layer of the ONO structure is adapted to have a plurality of charge storage regions.

18. The method of claim 15 wherein the wordline is comprised of polysilicon.

19. The method of claim 15 wherein the second set of trenches is formed to a different depth than the first set of trenches.

20. The method of claim 15 wherein the substrate is comprised of p-type silicon.

* * * * *